(12) United States Patent
Shibata et al.

(10) Patent No.: US 7,084,465 B2
(45) Date of Patent: Aug. 1, 2006

(54) SEMICONDUCTOR DEVICE HAVING DEVICE ISOLATION REGION AND PORTABLE ELECTRONIC DEVICE

(75) Inventors: Akihide Shibata, Nara (JP); Hiroshi Iwata, Ikoma-gun (JP); Seizo Kakimoto, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/451,744

(22) PCT Filed: Dec. 26, 2001

(86) PCT No.: PCT/JP01/11228

§ 371 (c)(1),
(2), (4) Date: Jul. 31, 2003

(87) PCT Pub. No.: WO02/052649

PCT Pub. Date: Jul. 4, 2002

(65) Prior Publication Data

US 2004/0079999 A1 Apr. 29, 2004

(30) Foreign Application Priority Data

Dec. 26, 2000 (JP) .............................. 2000-395472

(51) Int. Cl.
*H01L 31/113* (2006.01)

(52) U.S. Cl. ..................... 257/392; 257/213; 257/288; 257/368; 257/E29.263

(58) Field of Classification Search ................. 257/382, 257/400, 401, 367, 351, 402, 320, 371, 374, 257/352, 355
See application file for complete search history.

(56) References Cited

U.S. PATENT DOCUMENTS

| 3,643,139 | A | * | 2/1972 | Nienhuis |
| 4,506,436 | A | * | 3/1985 | Bakeman et al. |
| 4,722,910 | A | * | 2/1988 | Yasaitis |
| 6,040,610 | A |   | 3/2000 | Noguchi et al. |
| 6,054,344 | A | * | 4/2000 | Liang et al. |
| 6,228,704 | B1 |  | 5/2001 | Uchida |

(Continued)

FOREIGN PATENT DOCUMENTS

JP 6-216346 A 8/1994

(Continued)

OTHER PUBLICATIONS

Wolf, "Silicon Processing for the VLSI Era, vol. 2—Process Integration," 1990, Lattice Press, p. 12-13.*

(Continued)

*Primary Examiner*—Nathan J. Flynn
*Assistant Examiner*—Kevin Quinto
(74) *Attorney, Agent, or Firm*—Birch, Stewart, Kolasch & Birch, LLP

(57) ABSTRACT

There is provided a semiconductor device including DTMOS and a substrate variable-bias transistor and a portable electronic device both operable with reduced power consumption. N-type deep well regions are formed in one P-type semiconductor substrate. The N-type deep well regions are electrically isolated by the P-type semiconductor substrate. Over the N-type deep well regions, a P-type deep well region and a P-type shallow well region are formed to fabricate an N-type substrate variable-bias transistor. Over the N-type deep well region, an N-type shallow well region is formed to fabricate a P-type substrate variable-bias transistor. Further a P-type DTMOS and an N-type DTMOD are fabricated.

13 Claims, 12 Drawing Sheets

U.S. PATENT DOCUMENTS 6,255,704 B1   7/2001   Iwata et al.
6,261,921 B1 * 7/2001   Yen et al.
6,465,295 B1 * 10/2002  Kitamura

FOREIGN PATENT DOCUMENTS

| JP | 10-22462 A   | 1/1998  |
|----|--------------|---------|
| JP | 10-199968 A  | 7/1998  |
| JP | 10-340998 A  | 12/1998 |
| JP | 11-289060 A  | 10/1999 |
| JP | 2000-82815 A | 3/2000  |

OTHER PUBLICATIONS

Wolf, "Silicon Processing for the VLSI Era, vol. 3—Submicron MOSFET," 1995, Lattice Press, p. 373-376.*

Kotaki et al., Novel Bulk Dynamic Threshold Voltage MOSFET (B-DTMOS) with Advanced Isolation (SITOS) and Gate to Shallow Well Contact (SSS-C) Processes for Ultra Low Power Dual Gate CMOS, IEDM Tech. Dig., pp. 459-462, 1996.

* cited by examiner

US 7,084,465 B2

SEMICONDUCTOR DEVICE HAVING DEVICE ISOLATION REGION AND PORTABLE ELECTRONIC DEVICE

This application is the national phase under 35 U.S.C. § 371 of PCT International Application No. PCT/JP01/11228 which has an International filing date of Dec. 21, 2001, which designated the United States of America.

BACKGROUND OF THE INVENTION

1. Technical Field

The present invention relates to semiconductor devices and portable electronic device. More specifically, the invention relates to a semiconductor device using a dynamic threshold transistor and a substrate bias-variable transistor, as well as a portable electronic device using this semiconductor device.

2. Background Art

In order to decrease power consumption in CMOS (Complementary Metal Oxide Semiconductor) circuits using MOSFETs (Metal Oxide Semiconductor Field Effect Transistors), it is most effective to lower the power supply voltage. However, merely lowering the power supply voltage would cause the drive current of MOSFETs to lower, resulting in a lower operating speed of the circuit. This phenomenon is known to become noticeable as the power supply voltage becomes a triple or less of the threshold of the transistor. Although this phenomenon can be prevented by lowering the threshold, doing so would give rise to a problem of increases in off-leak current of MOSFETs. Therefore, the lower limit of the threshold is defined within a range over which the above problem does not occur. This in turn defines the limits of power consumption reduction since the lower limit of the threshold corresponds to the lower limit of the power supply voltage.

Conventionally, there has been proposed a dynamic-threshold transistor (hereinafter, referred to as DTMOS) which performs dynamic-threshold operations and which employs a bulk substrate for alleviation of the above-mentioned problem (Japanese Patent Laid-Open Publications HEI 10-22462, Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS, H. Kotaki et al., IEDM Tech. Dig., p. 459, 1996). The aforementioned DTMOS has a characteristic of a capability of obtaining high drive current with low power supply voltage by virtue of its effective threshold lowering in an ON state. The reason why the effective threshold of a DTMOS lowers in the ON state is that the gate electrode and the well region are electrically short-circuited.

The principle of operation of the N-type DTMOS is explained below. It is noted that the P-type DTMOS operates similarly with the polarity reversed. In the N-type DTMOS, when the gate electrode voltage is at a low level (in an OFF state), the P-type well region voltage is also at a low level, the effective threshold has no differences from normal MOSFETs. Therefore, the off current value (off-leak) is the same as in the case of normal MOSFETs.

On the other hand, when the gate electrode voltage is at a high level (in an ON state), the P-type well region voltage is also at a high level, and the effective threshold lowers by the substrate bias effect, so that the drive current increases compared with those of normal MOSFETs. Therefore, large drive current can be obtained with low power supply voltage while low leak current is maintained.

In a DTMOS, the gate electrode and the well region are electrically short-circuited. Therefore, as the gate electrode voltage changes, the well voltage also changes similarly. This accordingly requires the well region of each DTMOS to be mutually electrically isolated from the well regions of its neighboring MOSFETs. For this reason, the well region is made up of a shallow well region and a deep well region which are different in conductive type from each other. Furthermore, the shallow well regions of the respective DTMOSs are electrically isolated from one another by a device isolation region.

As a conventional method for suppressing off-leaks in low voltage drive and still obtaining high drive current, there has been a method in which the well-bias voltage is changed between standby and active states (Japanese Patent Laid-Open Publications HEI 6-216346 and 10-340998).

Hereinafter, a MOSFET in which the well bias is changed between standby and active states will be referred to as substrate bias-variable transistor.

The principle of operation of the N-type substrate bias-variable transistor is explained below. It is noted that the P-type substrate bias-variable transistor operates similarly with the polarity reversed. In an N-type substrate bias-variable transistor, when the circuit is in an active state, a 0 V or positive voltage (with a source voltage referenced) is applied from a bias generation circuit to the P-type well region. With a positive voltage applied to the P-type well region, the effective threshold lowers due to a substrate bias effect, and the drive current increases as compared with the case of normal MOSFETs. When the circuit is in a standby state, on the other hand, a negative voltage is applied from the bias generation circuit to the P-type well region. As a result of this, the effective threshold increases due to the substrate bias effect, and the off-leak decreases as compared with normal MOSFETs or DTMOSs.

Generally, in a circuit using substrate bias-variable transistors, whether the active state or the standby state is effectuated is selected from circuit block to circuit block. This is because providing the bias generation circuit for each device causes the number of devices and the circuit area to increase considerably. From these reasons, the P-type well region of an N-type MOSFET is common within a circuit block (the case is the same with the N-type well region of a P-type MOSFET). Accordingly, in a circuit block which is in an active state, a 0 V or positive voltage is applied to the well regions of all the N-type MOSFETs, so that the off-leak increases as compared with normal MOSFETs or DTMOSs (the case is the same also with the P-type MOSFETs).

In the circuit using substrate bias-variable transistors, MOSFETs within a circuit block have to share a well region. For this purpose, the depth of the bottom face of the device isolation region is set deeper than the depth of the junction between the source regions and drain regions of the MOSFETs and their shallow well region and, at the same time, shallower than the depth of the lower end of the shallow well region.

There has been disclosed a technique in which the DTMOS and the substrate bias-variable transistor are combined together to make the best of their respective advantages (Japanese Patent Laid-Open Publication HEI 10-340998).

FIG. 10 shows a cross-sectional view of a device fabricated by this technique. Referring to FIG. 10, there are shown, with reference numerals having the following denotations, a P-type semiconductor substrate 11, an N-type deep well region 12, a P-type deep well region 13, an N-type shallow well region 14, a P-type shallow well region 15, a device isolation region 16, an N-type MOSFET source region 17, an N-type MOSFET drain region 18, a P-type MOSFET source region 19, a P-type MOSFET drain region 20, an N$^+$ diffusion layer 21 for providing contact with an N-type shallow well region, a P$^+$ diffusion layer 22 for providing contact with a P-type shallow well region, a gate insulator 23, a gate electrode 24, a P-type substrate bias-variable transistor 25, an N-type substrate bias-variable transistor 26, an N-type DTMOS 27, a P-type DTMOS 28, a well-bias input terminal 29 for the P-type substrate bias-variable transistor, a well-bias input terminal 30 for the N-type substrate bias-variable transistor, and a fixed bias input terminal 31 for the P-type deep well region. In addition, although not shown, the gate electrode 24 and the P-type shallow well region 15 are electrically short-circuited in the N-type DTMOS 27, and the gate electrode 24 and the N-type shallow well region 14 are electrically short-circuited in the P-type DTMOS 28.

In the DTMOSs 27 and 28, the voltages of the shallow well regions 14 and 15 change according to the voltage of the gate electrode 24. In order to prevent changes of the voltages of the shallow well regions 14 and 15 from affecting shallow well regions of other devices, deep well regions 13 and 12 opposite in conductive type to the shallow well regions 14 and 15 are formed under those shallow well regions 14 and 15. Moreover, a device isolation region 16 is formed at enough depth to electrically isolate shallow well regions 14 and 15 of mutually neighboring devices. By doing so, the shallow well regions 14 and 15 are electrically isolated from shallow well regions 14 and 15 of neighboring devices. Meanwhile, shallow well regions 14, 15 of the substrate bias-variable transistors 25, 26 contained in one circuit block have to be provided in common. Therefore, under the P-type shallow well regions 15 of the N-type substrate bias-variable transistors 26 in FIG. 10, is formed the P-type deep well region 13, which is integrated with a P-type shallow well region 15 to form a common well region. To this P-type common well region, a voltage that differs between active and standby states is given via the well-bias input 30 for the N-type substrate bias-variable transistor 26. In order to prevent any effects on devices of other circuit blocks or DTMOS portion, the N-type deep well region 12 is formed further deeper in the substrate, by which the P-type deep well region 13 is electrically isolated.

Under the N-type shallow well region 14 of the P-type substrate bias-variable transistor 25 in FIG. 10, is formed the N-type deep well region 12, which is integrated with the N-type shallow well region 14 to form a common well region. To this N-type common well region, a voltage that differs between active and standby states is given via the well-bias input terminal 29 for the P-type substrate bias-variable transistor 25.

FIGS. 11 and 12 show the procedure of forming the deep well regions of this prior-art semiconductor device. As shown in FIG. 11, with photoresist 33 used as a mask, dopant injection for forming the P-type deep well region 13 is performed, and then dopant injection for forming an N-type deep well region 12a further deeper is performed. Next, as shown in FIG. 12, with photoresist 34 used as a mask, dopant injection for forming an N-type deep well region 12b is performed. In this case, the depth of the N-type deep well region 12b is set to a level similar to the depth of the P-type deep well region 13. By these steps, the N-type deep well regions 12a and 12b are integrated together, by which the P-type deep well region 13 is electrically isolated.

In this way, the substrate bias-variable transistors 25, 26 and the DTMOSs 27, 28 are formed on the same substrate 11, making it possible to realize a circuit making the best of their respective advantages.

In the conventional semiconductor device, shown in FIG. 10, in which the DTMOSs 27, 28 and the substrate bias-variable transistors 25, 26 are combined together, although the P-type deep well regions 13 can be electrically isolated, the N-type deep well region 12 is common within one substrate 11. Therefore, although the circuit block of the N-type substrate bias-variable transistors 26, 26 can be formed plurally within the same substrate 11, the circuit block of the P-type substrate bias-variable transistor 25, 25 cannot be formed plurally, so that a plurality of circuit blocks cannot be divided properly into circuit blocks of the active state and circuit blocks of the standby state. For example, even when only part of the P-type gsubstrate bias-variable transistors 25, 25 need to be put into active state, the entirety of the P-type substrate bias-variable transistors 25, 25 would come into an active state, causing the leak current to increase. As a result, the power consumption would increase.

SUMMARY OF THE INVENTION

The present invention having been accomplished with a view to solving these and other problems, it is therefore an object of the invention to reduce the power consumption of a semiconductor device, as well as a portable electronic device, using DTMOSs and substrate bias-variable transistors.

According to the present invention, there is provided a semiconductor device comprising:

a first-conductive-type semiconductor substrate;

a plurality of second-conductive-type deep well regions formed in the semiconductor substrate;

a first-conductive-type deep well region formed in the second-conductive-type deep well regions;

a first first-conductive-type shallow well region formed on the first-conductive-type deep well region;

a first second-conductive-type shallow well region formed on the first-conductive-type deep well region;

a second first-conductive-type shallow well region formed on the second-conductive-type deep well regions;

a second second-conductive-type shallow well region formed on the second-conductive-type deep well regions;

a device isolation region;

a second-conductive-type field effect transistor formed on the first first-conductive-type shallow well region;

an input terminal which is formed on the first first-conductive-type shallow well region and which serves for changing a substrate bias of the second-conductive-type field effect transistor;

a first-conductive-type field effect transistor formed on the second second-conductive-type shallow well region;

an input terminal which is formed on the second second-conductive-type shallow well region and which serves for changing a substrate bias of the first-conductive-type field effect transistor;

a second-conductive-type dynamic threshold transistor which is formed on the second first-conductive-type shallow well region and in which a gate electrode and the second first-conductive-type shallow well region are electrically connected to each other; and a first-conductive-type dynamic threshold transistor which is formed on the first second-conductive-type shallow well region and in which a gate electrode and the first second-conductive-type shallow well region are electrically connected to each other, wherein the second first-conductive-type shallow well region is electrically isolated from device to device by the device isolation region and the second-conductive-type deep well regions, and the first second-conductive-type shallow well region is isolated from device to device by the device isolation region and the first-conductive-type deep well region.

By virtue of the formation of the plurality of second-conductive-type deep well regions as shown above, it becomes implementable to form, on one substrate, not only a plurality of circuit blocks of second-conductive-type substrate-bias field effect transistors (substrate bias-variable transistors), as has been in the prior art, but also a plurality of circuit blocks of first-conductive-type substrate-bias field effect transistors. Therefore, with respect to each of the circuit blocks of first-conductive-type substrate-bias field effect transistors and the circuit blocks of second-conductive-type substrate-bias field effect transistors, it becomes possible to properly divide the circuit blocks into circuit blocks that should be put into the active state and circuit blocks that should be put into the standby state, so that the power consumption of the semiconductor device can be reduced.

Herein, the terms, "first conductive type", refer to P-type or N-type. The terms, "second conductive type", refer to N-type when the first conductive type is P-type, or to P-type when the first conductive type is N-type.

In one embodiment, the plurality of second-conductive-type deep well regions are electrically isolated by the first-conductive-type semiconductor substrate.

In this embodiment, since the plurality of second-conductive-type deep well regions are electrically isolated by the first-conductive-type semiconductor substrate, the plurality of second-conductive-type deep well regions are electrically isolated with simplicity and low cost.

In one embodiment, a first-conductive-type dopant region is formed between the plurality of second-conductive-type deep well regions, and the plurality of second-conductive-type deep well regions are electrically isolated by the first-conductive-type semiconductor substrate and the first-conductive-type dopant region.

In this embodiment, since the first-conductive-type dopant region is present between the plurality of second-conductive-type deep well regions, punch-throughs between the plurality of second-conductive-type deep well regions are suppressed. Therefore, the margin between the plurality of second-conductive-type deep well regions is diminished, allowing the degree of integration to be improved.

In one embodiment, a device isolation region is formed between the plurality of second-conductive-type deep well regions, and the plurality of second-conductive-type deep well regions are electrically isolated by the first-conductive-type semiconductor substrate and the device isolation region.

In this embodiment, since the device isolation region is present between the plurality of second-conductive-type deep well regions, parasitic capacitance between the well regions (and silicon substrate) and gate lines or metal lines can be reduced.

In one embodiment, a first-conductive-type dopant region and a device isolation region are formed between the plurality of second-conductive-type deep well regions, and the plurality of second-conductive-type deep well regions are electrically isolated by the first-conductive-type semiconductor substrate, the first-conductive-type dopant region and the device isolation region.

According to this embodiment, since the first-conductive-type dopant region and the device isolation region are present between the plurality of second-conductive-type deep well regions, the margin between the second-conductive-type deep well regions can be diminished, and the parasitic capacitance between the well regions (and silicon substrate) and gate lines or metal lines can be reduced.

In one embodiment, the plurality of second-conductive-type deep well regions are electrically isolated at a boundary between the first-conductive-type field effect transistor and the second-conductive-type field effect transistor, at a boundary between the first-conductive-type field effect transistor and the first-conductive-type dynamic threshold transistor, or at a boundary between the first-conductive-type field effect transistor and the second-conductive-type dynamic threshold transistor.

According to this embodiment, the plurality of second-conductive-type deep well regions are electrically isolated at boundaries between the second-conductive-type deep well regions in circuit blocks of the first-conductive-type field effect transistors (substrate bias-variable transistors) and the second-conductive-type deep well regions in other device portions (circuit blocks of second-conductive-type substrate bias-variable transistors, and first-conductive-type dynamic threshold transistors, and second-conductive-type dynamic threshold transistors).

Therefore, it becomes implementable not only to form, on one substrate, a plurality of circuit blocks of first-conductive-type substrate bias-variable transistors as well as a plurality of circuit blocks of second-conductive-type substrate bias-variable transistors, but also to reduce the junction capacitance between the second-conductive-type deep well regions and the other well regions. Besides, it becomes achievable to suppress the latch-up phenomenon.

In one embodiment, out of the device isolation regions, given a width A of either a device isolation region of which a shallow well region placed on one side and a shallow well region placed on the other side are different in conductive type from each other, or a device isolation region of which a deep well region placed on one side and a deep well region placed on the other side are different in conductive type from each other and moreover which is in contact with the deep well regions placed on both sides thereof, and given a width B of a device isolation region of which a shallow well region placed on one side and a shallow well region placed on the other side are identical in conductive type to each other and of which a deep well region placed on one side and a deep well region placed on the other side are identical in conductive type to each other and which is in contact with the deep well regions placed on both sides thereof, then A>B.

According to this embodiment, punch-throughs between well regions and threshold shifts of devices due to dopant diffusion can be suppressed.

In one embodiment, out of the device isolation regions, given a width A of either a device isolation region of which a shallow well region placed on one side and a shallow well region placed on the other side are different in conductive type from each other, or a device isolation region of which a deep well region placed on one side and a deep well region placed on the other side are different in conductive type from each other and moreover which is in contact with the deep well regions placed on both sides thereof, then $0.18\ \mu m < A < 0.7\ \mu m$.

According to this embodiment, punch-throughs between well regions and threshold shifts of devices due to dopant diffusion can be suppressed.

In one embodiment, the device isolation regions are formed of STI (Shallow Trench Isolation).

According to this embodiment, since the device isolation regions are formed of STI, it becomes implementable to easily form device isolation regions of various widths, so that the semiconductor device can be manufactured with simplicity and low cost.

In one embodiment, a complementary circuit is made up by the first-conductive-type dynamic threshold transistor and the second-conductive-type dynamic threshold transistor, or by the first-conductive-type field effect transistor and the second-conductive-type field effect transistor, or by the first-conductive-type dynamic threshold transistor and the second-conductive-type field effect transistor, or by the first-conductive-type field effect transistor and the second-conductive-type dynamic threshold transistor.

According to this embodiment, since the complementary circuit is made up, the power consumption can even further be reduced.

The portable electronic device according to one embodiment includes the semiconductor device.

This portable electronic device, by virtue of its including the semiconductor device as described above, is reduced in the power consumption of LSI (Large-Scale Integrated Circuit) parts or the like to a large extent, thus capable of prolonging the battery life to a large extent.

DESCRIPTION OF THE INVENTION

Hereinbelow, the present invention is described in detail by way of embodiments thereof illustrated in the accompanying drawings.

Semiconductor substrates to be used for the present invention, although not particularly limited, are preferably silicon substrates. The semiconductor substrate may have either conductive type, P-type or N-type. It is noted that the following embodiments show a case where a P-type semiconductor substrate is used. In the case where an N-type semiconductor substrate is used, reversing the conductive type of all the injected dopants given hereinbelow allows a semiconductor device of similar functions to be fabricated.

EMBODIMENT 1

Figure 1:
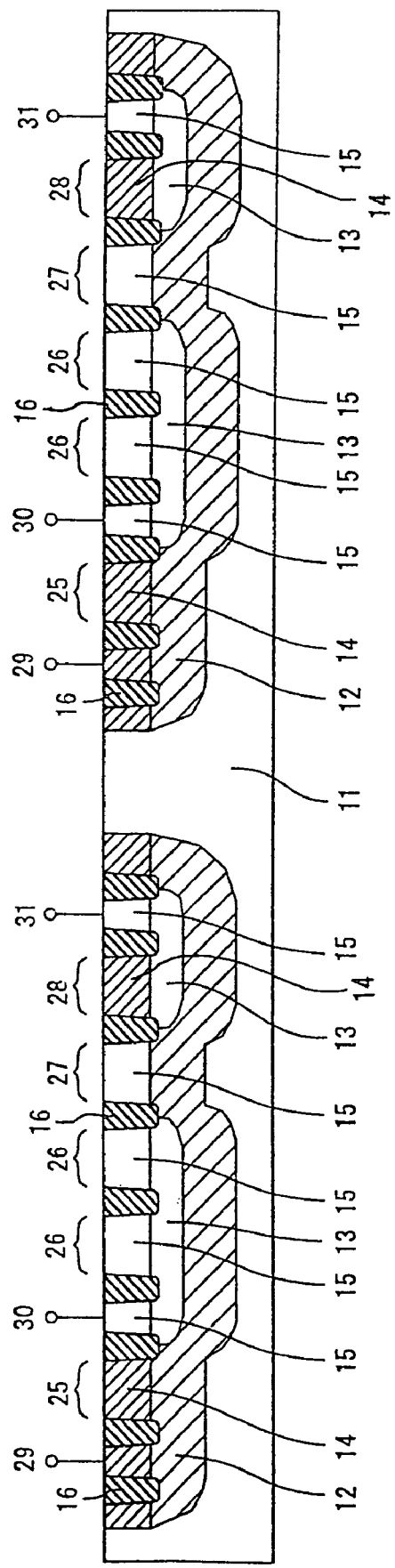
FIG. 1 is a sectional view of a semiconductor device of Embodiment 1 of the present invention.

Embodiment 1 of the present invention is described with reference to FIG. 1. FIG. 1 is a sectional view of a semiconductor device of Embodiment 1 of the invention. In FIG. 1, gate insulator, gate electrode, source region, drain region, interlayer insulator and upper metal interconnects are omitted. Also, though the structure is omitted in FIG. 1, reference numerals 25, 26 represent substrate bias-variable transistors having the same structure as that of the prior-art example shown in FIG. 10, and reference numerals 27, 28 represent DTMOSs having the same structure as that of the prior-art example shown in FIG. 10. Further, in FIG. 1, the same constituent parts as those of the prior-art example shown in FIG. 10 are designated by the same reference numerals as those of FIG. 10 and their description is omitted.

Figure 10:
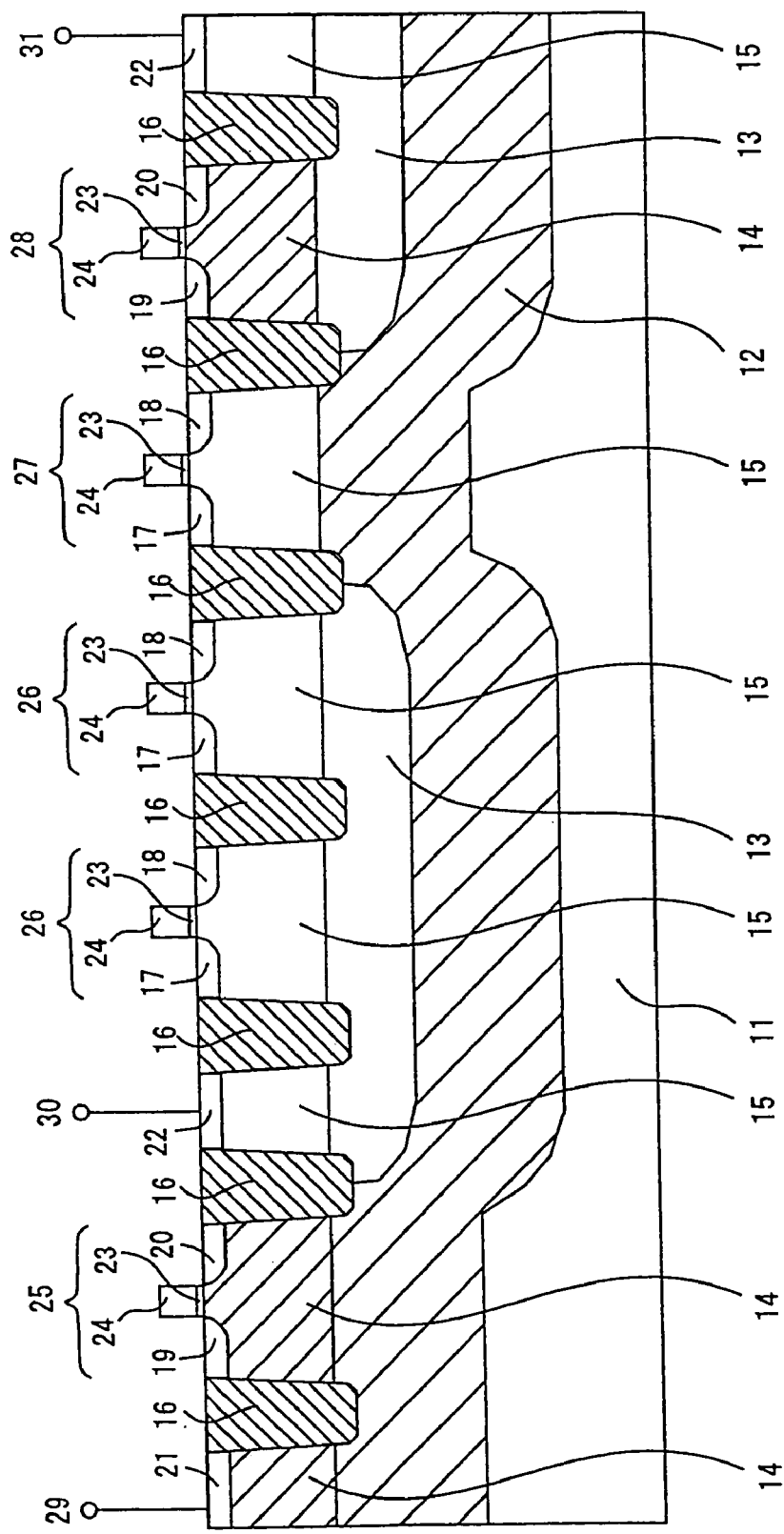
FIG. 10 is a sectional view of a conventional semiconductor device.
Figure 11:
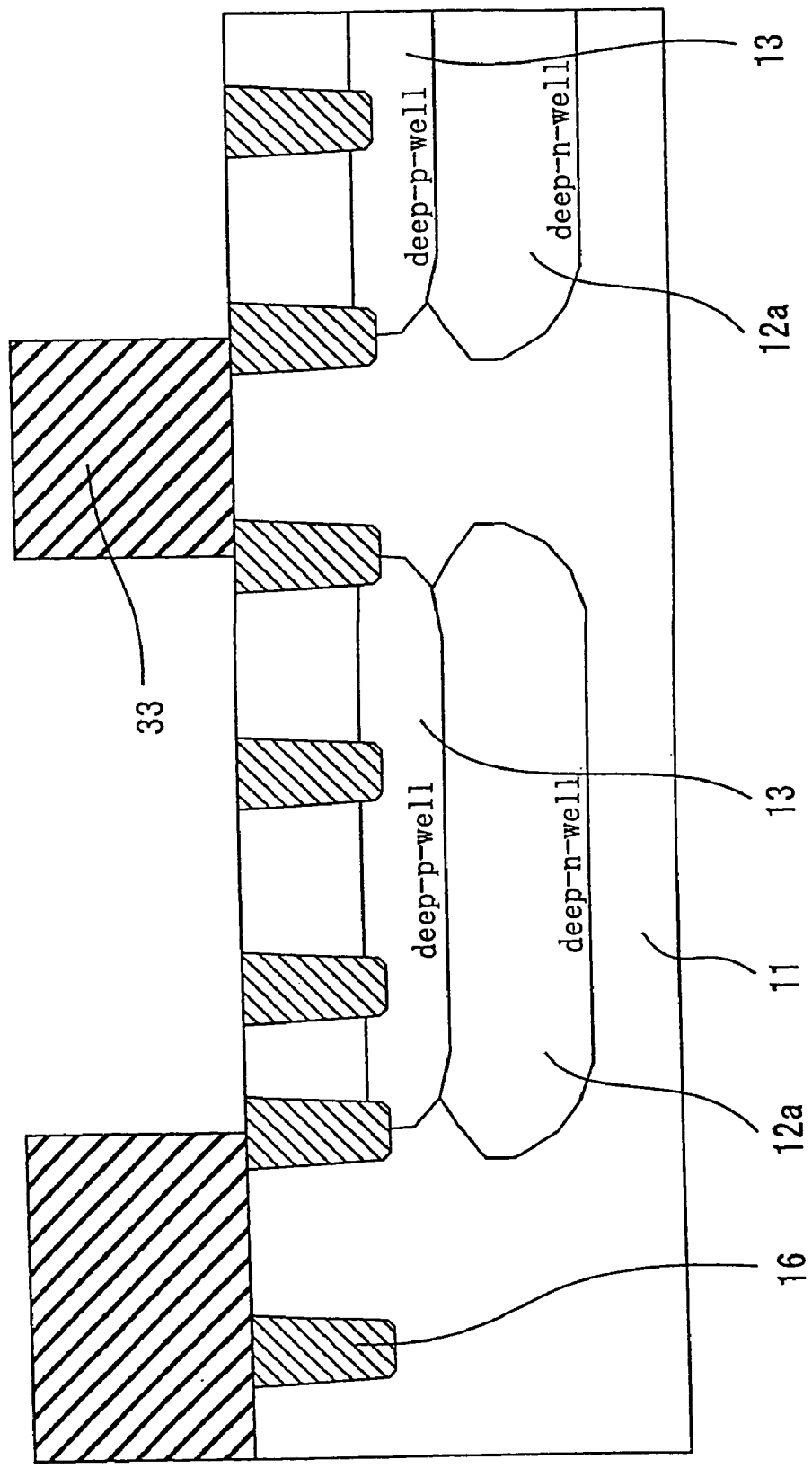
FIG. 11 is a view showing the method of fabricating deep well regions of the conventional semiconductor device.
Figure 12:
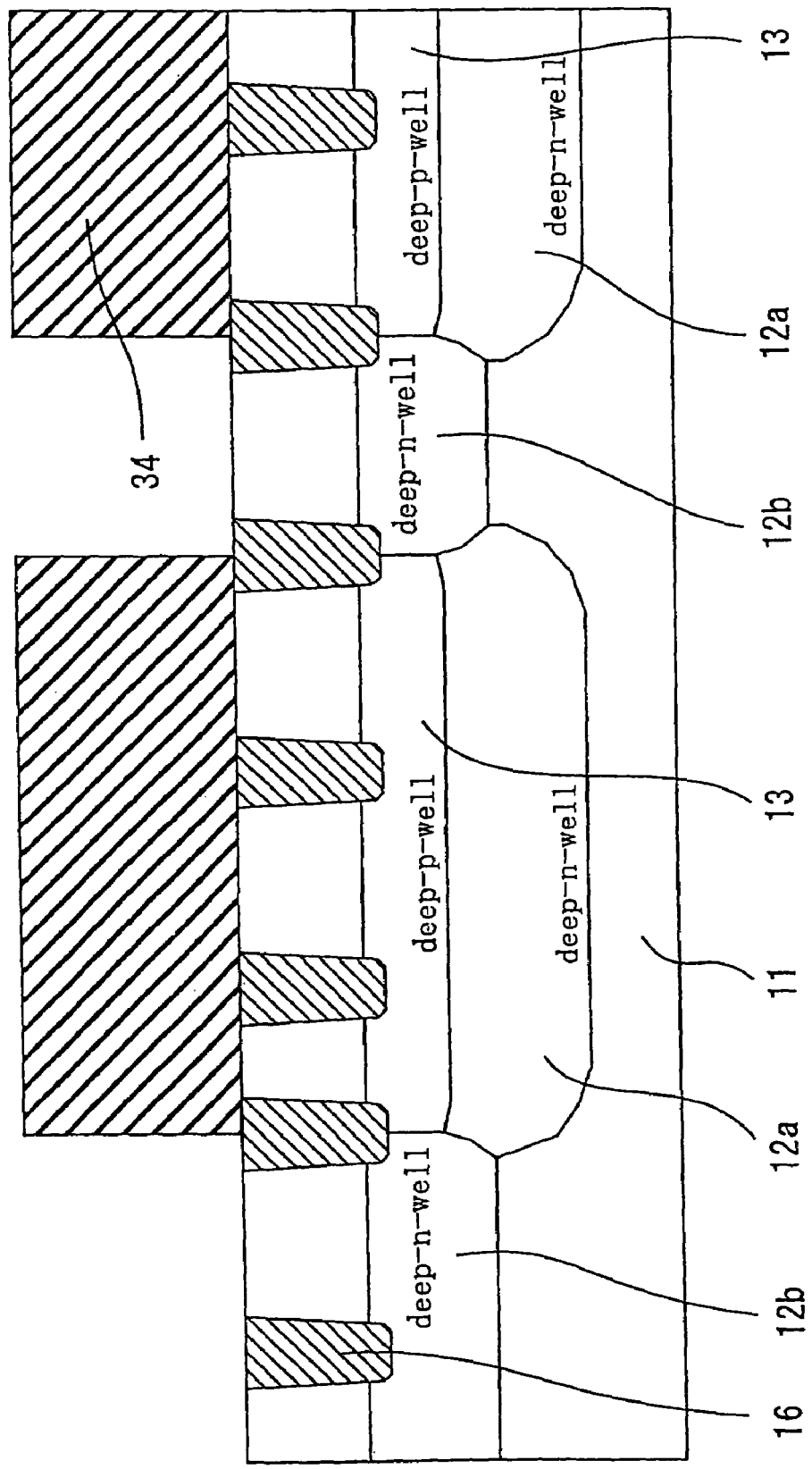
FIG. 12 is a view showing the method of fabricating deep well regions of the conventional semiconductor device.

In the semiconductor device of FIG. 1, the N-type deep well region 12 in the prior-art semiconductor device shown in FIG. 10 is electrically parted at a region where no well dopant is injected (the portion of P-type semiconductor substrate 11). The region where no well dopant is injected can be formed by masking there with photoresist in the process of well dopant injection.

Next, the procedure for fabricating the semiconductor device shown in FIG. 1 is described. Device isolation regions 16 are formed on the semiconductor substrate 11. The device isolation regions 16 can be formed by using, for example, STI process. However, the method for forming the device isolation regions 16, not being limited to the STI process, needs only to have a function that the device isolation regions 16 electrically isolate the shallow well region. For example, the substance to be filled in the device isolation regions may be not only silicon oxide or silicon nitride but also electrically conductive substances such as polysilicon or amorphous silicon. However, when electrically conductive substance such as polysilicon or amorphous silicon is buried, it is necessary to ensure non-conductivity of the device isolation regions by, for example, preliminarily oxidizing side walls of the device isolation regions 16.

The depth of the device isolation regions 16 is set to such a level that shallow well regions of mutually neighboring devices are electrically isolated and that their deep well regions are not electrically isolated. The depth of the device isolation regions 16 is preferably, 0.2 to 2 µm, for example.

Next, a plurality of N-type deep well regions 12, 12 are formed on the semiconductor substrate 11. The difference from the procedure of the prior-art example is that places where the N-type deep well regions 12, 12 are parted from each other are masked with photoresist so that dopant injection is not applied thereto. Conditions of dopant injection may be the same as those will be described later in Embodiment 4.

In addition, although the N-type deep well regions 12, 12 are electrically parted from each other by the semiconductor substrate (P-type in conductive type) 11, yet a low dopant level (about $10^{15}$ cm$^{-3}$) of the semiconductor substrate 11 has a need for providing enough partition width for prevention of occurrence of punch-throughs between the N-type deep well regions 12, 12.

Next, P-type deep well regions 13, 13 are formed on the N-type deep well regions 12, 12, respectively. Conditions of dopant injection may be the same as those will be described later in Embodiment 4. Two P-type deep well regions 13, 13 on each one N-type deep well region 12 are electrically parted from each other by a shallow portion of the N-type deep well region 12. Further, a first N-type shallow well region 14 is formed on the P-type deep well region 13, and moreover a second N-type shallow well region 14 is formed on the N-type deep well region 12. An example of dopant ions that give the N-type conductivity is $^{31}P^+$. For example, when $^{31}P^+$ is used as dopant ions, the well region can be formed under the conditions of an injection energy of 130 to 900 keV and an injection quantity of $5\times10^{11}$ to $1\times10^{14}$ cm$^{-2}$.

Next, a first P-type shallow well region 15 is formed on the P-type deep well region 13, and moreover a second P-type shallow well region 15 is formed on the N-type deep well region 12. An example of dopant ions that give the P-type conductivity is $^{11}B^+$. For example, when $^{11}B^+$ ions are used as dopant ions, the well region can be formed under the conditions of an injection energy of 60 to 500 keV and an injection quantity of $5\times10^{11}$ to $1\times10^{14}$ cm$^{-2}$.

The order of dopant injection for forming the well regions is not limited to the above-described one, and may be changed.

It is noted that the depth of the junction between the shallow well regions 14, 15 and the deep well regions 12, 13 as well as the depth of the junction between the N-type deep well region 12 and the P-type deep well region 13 are determined according to the injection conditions for the shallow well regions 14, 15, the injection conditions for the deep well regions 12, 13 and the thermal processes to be performed afterwards. The depth of the device isolation regions 16 is set to such a level that the shallow well regions 14, 15 of neighboring devices are electrically isolated and that their deep well regions 12, 13 are not electrically isolated.

Furthermore, for reduction of resistance of the shallow well regions 14, 15, heavily doped buried regions of the same conductive type as the dopant ions of the shallow well regions 14, 15 may be formed in the shallow well regions 14, 15. Reduced resistance of the shallow well regions 14, 15 allows an input to the gate electrode to be promptly propagated to the shallow well regions 14, 15, making it possible to obtain the full substrate bias effect so that higher-speed operations of the DTMOSs 27, 28 can be implemented. The heavily doped buried regions can be formed under the conditions of, for example, dopant ions of $^{11}B^+$, an injection energy of 100 to 400 keV and an injection quantity of $1\times10^{12}$ to $1\times10^{14}$ cm$^{-2}$ for the formation in the P-type shallow well region, or conditions of dopant ions of $^{31}P^+$, an injection energy of 240 to 750 keV and an injection quantity of $1\times10^{12}$ to $1\times10^{14}$ cm$^{-2}$ for the formation in the N-type shallow well region.

Further, in order to prevent the dopant level from being excessively lightened in the substrate surface region, dopant ions of the same conductive type as the dopant ions of the shallow well regions 14, 15 may also be injected as a punch-through stopper injection into the shallow well regions 14, 15. The punch-through stopper injection can be carried out, for example, under the conditions of dopant ions of $^{11}B^+$, an injection energy of 10 to 60 keV and an injection quantity of $5\times10^{11}$ to $1\times10^{13}$ cm$^{-2}$ for the formation in the P-type shallow well region 15, or conditions of dopant ions of $^{31}P^+$, an injection energy of 30 to 150 keV and an injection quantity of $5\times10^{11}$ to $1\times10^{13}$ cm$^{-2}$ for the formation in the N-type shallow well region 14.

Next, although not shown, a gate insulator and a gate electrode (see the gate insulator 23 and the gate electrode 24 of the prior-art example shown in FIG. 10) are formed in this order.

Material of the gate insulator is not particularly limited as far as it has insulation property. When a silicon substrate 11 is used as in this Embodiment 1, silicon oxide, silicon nitride or a laminate of those may be used for the gate insulator. Further, high-permittivity films of aluminum oxide, titanium oxide, tantalum oxide or the like or their laminates may also be used. Preferably, the gate insulator has a thickness of 1 to 10 nm in the case where silicon oxide is used. The gate insulator can be formed by CVD (Chemical Vapor Deposition) process, sputtering process, thermal oxidation or other like process.

Next, material of the gate electrode is not particularly limited as far as it has electrical conductivity. When a silicon substrate is used, silicon films of polysilicon, single crystal silicon or the like may be mentioned as examples. Further, in addition to these, metal films of aluminum, copper or the like are available. Preferably, the gate electrode has a thickness of 0.1 to 0.4 μm. The gate electrode can be formed by CVD process, evaporation process or other like process.

Further, a side wall spacer may be formed on the side wall of the gate electrode. Material of this side wall spacer is not particularly limited as far as it is an insulating film, and exemplified by silicon oxide, silicon nitride and the like.

Next, although not shown, a gate-substrate connection region is formed at portions that are to form the DTMOSs. In regions other than the source regions, the drain regions and the channel regions, for the formation of a gate-substrate connection region for electrically connecting the gate electrode and the shallow well regions to each other, the gate electrode and the gate oxide are partly etched until the ground substrate is exposed. In this exposed region, a heavily doped region (P-type heavily doped region in NMOS, and N-type heavily doped region in PMOS) is formed. In a silicification step to be performed later, the gate electrode and the shallow well regions are electrically connected to each other in the gate-substrate connection region.

Next, although not shown, source regions and drain regions of a conductive type opposite to the conductive type of the shallow well regions 14, 15 are formed on the surface layer of the shallow well regions 14, 15.

The source regions and the drain regions can be formed in self-alignment fashion, for example, by injecting dopant ions of a conductive type opposite to the conductive type of the shallow well regions with the gate electrode used as a mask. The source regions and the drain regions can be formed, for example, under the conditions of an injection energy of 3 to 100 keV and an injection quantity of $1\times10^{15}$ to $1\times10^{16}$ cm$^{-2}$ for the case where $^{75}As^+$ ions are used as dopant ions, or conditions of an injection energy of 1 to 20 keV and an injection quantity of $1\times10^{15}$ to $1\times10^{16}$ cm$^{-2}$ for the case where $^{11}B^+$ ions are used as dopant ions. It is noted that the surface layers of the shallow well regions under the gate electrode function as channel regions.

Further, the source regions and the drain regions may have an LDD (Lightly Doped Drain) region on their gate electrode side. The LDD region can be formed in self-alignment fashion, for example, by injecting dopant ions of a conductive type opposite to the conductive type of the shallow well regions with the gate electrode used as a mask. In this case, the source regions and the drain regions can be formed in self-alignment fashion by, after the formation of the LDD region, forming the side wall spacer on the side wall of the gate electrode and injecting ions with the gate electrode and the side wall spacer used as masks. The dopant ion injection for forming the LDD region can be implemented, for example, under the conditions of an injection energy of 3 to 100 keV and an injection quantity of $5\times10^{13}$ to $1\times10^{15}$ cm$^{-2}$ for the case where $^{75}$As$^+$ ions are used as dopant ions, or conditions of an injection energy of 1 to 20 keV and an injection quantity of $1\times10^{13}$ to $5\times10^{14}$ cm$^{-2}$ for the case where $^{11}$B$^+$ ions are used as dopant ions.

In addition, as the dopant ions for forming the source regions, the drain regions and the LDD region, it is also possible to use $^{31}$P$^+$ ions, $^{122}$Sb$^+$ ions, $^{15}$In$^+$ ions, $^{49}$BF$_2^+$ ions or the like, in addition to the above-mentioned $^{11}$B$^+$ ions and $^{75}$As$^+$ ions.

Further, the source regions, the drain regions and the gate electrode have their surface layers silicified with a view to lowering their respective resistances and improving their electrical conductivities with their respective connecting lines. By this silicification, the gate electrode and the shallow well regions are electrically connected to each other in the gate-substrate connection region. The silicide may be given by, for example, tungsten silicide, titanium silicide, or the like.

In addition, the source regions and the drain regions may also be provided in a stacking type (see Japanese Patent Laid-Open Publication 2000-82815). In this case, the source regions and the drain regions can be made smaller in area, allowing higher integration to be achieved.

After that, an activation annealing for the dopants is performed. The activation annealing is carried out under such conditions that the dopants are fully activated and moreover prevented from being excessively diffused. For example, in the case where the N-type dopant is $^{75}$As$^+$ and the P-type dopant is $^{11}$B$^+$, it is appropriate that after the injection of $^{75}$As$^+$, an annealing is done at 800 to 1000° C. for about 10 to 100 minutes and subsequently, after the injection of $^{11}$B$^+$, an annealing is done at 800 to 1000° C. for 10 to 100 seconds. In addition, in order to obtain a gentler dopant profile for the shallow well regions and the deep well regions, another annealing may be performed before injecting dopants for the source regions and the drain regions.

After that, interconnecting lines and the like are formed by known techniques, and thus the semiconductor device can be formed.

Although the above description has been made on a case where only the substrate bias-variable transistors 25, 26 and the DTMOSs 27, 28 are formed for explanation's sake, it is also possible that normal MOSFETs are mixed therein. Otherwise, DTMOSs and normal MOSFETs only are also possible. In this case, the voltage for the shallow well regions may appropriately be fixed for devices that are to be formed into normal MOSFETs.

Thus, in the semiconductor device of this Embodiment 1, it becomes implementable to form, on one substrate 11, not only a plurality of circuit blocks of N-type substrate bias-variable transistors 26, 26 but also a plurality of circuit blocks of P-type substrate bias-variable transistors 25, 25. Therefore, with respect to the individual N-type and P-type circuit blocks, it becomes possible to properly divide the circuit blocks into circuit blocks that should be put into the active state and circuit blocks that should be put into the standby state, so that the power consumption of the semiconductor device can be reduced.

In the above-described Embodiment 1, a P-type semiconductor substrate 11 has been used. However, even when an N-type semiconductor substrate is used with the conductive type of each well region reversed to the foregoing, the absolutely same functions and effects can be obtained.

EMBODIMENT 2

Figure 2:
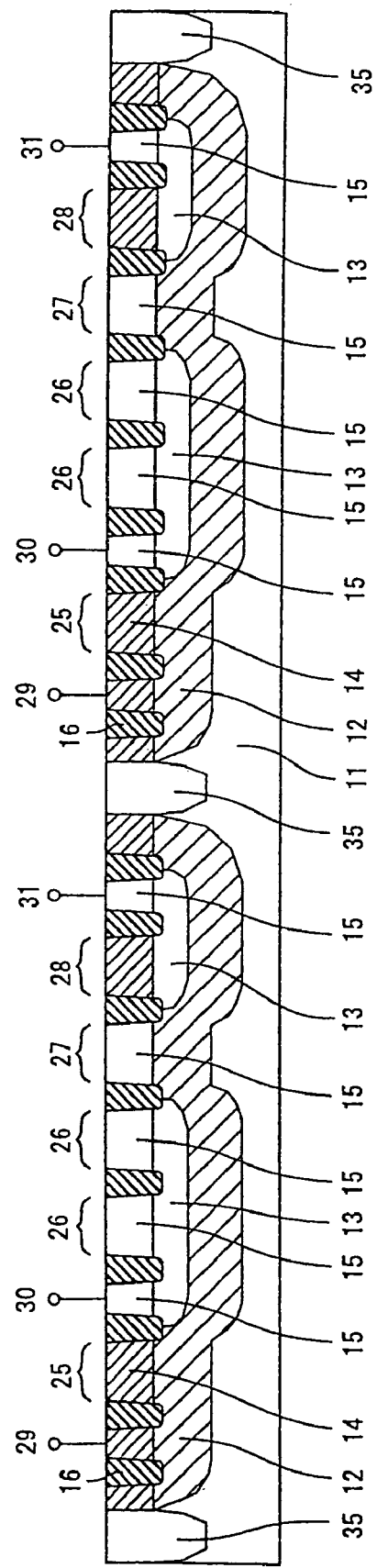
FIG. 2 is a sectional view showing a semiconductor device of Embodiment 2 of the invention.

Embodiment 2 of the present invention is described with reference to FIG. 2. FIG. 2 is a sectional view of a semiconductor device according to Embodiment 2 of the invention. In this FIG. 2, gate insulator, gate electrode, source region, drain region, interlayer insulator and upper metal interconnects are omitted. Also, in FIG. 2, the same constituent parts as those shown in FIG. 1 are designated by the same reference numerals as those of FIG. 1 and their description is omitted.

The semiconductor device of Embodiment 2 differs from the semiconductor device of Embodiment 1 in that a P-type dopant region 35 is provided at a place where the N-type deep well regions 12, 12 are parted from each other. The dopant level of this P-type dopant region 35 is higher than the dopant level of the P-type substrate 11 so that punch-throughs between the N-type deep well regions 12, 12 can effectively be suppressed. Therefore, the margin for electrical isolation between the N-type deep well regions 12, 12 can be reduced.

Next, the procedure for fabricating the semiconductor device shown in FIG. 2 is described. The procedure for fabricating the semiconductor device of this Embodiment 2 differs from the procedure for fabricating the semiconductor device of Embodiment 1 only in that a step for forming the P-type dopant region 35 is added.

The P-type dopant region 35, which is intended for isolation of the N-type deep well regions 12, 12, preferably has a depth generally similar to that of the N-type deep well regions 12. For this purpose, it is preferable to increase one more photomask for forming the P-type dopant region 35.

The dopant injection for forming the P-type dopant region 35 can be formed under the conditions of an injection energy of 100 to 1500 keV and an injection quantity of $5\times10^{11}$ to $1\times10^{14}$ cm$^{-2}$, for example, with $^{11}$B$^+$ ions used as the dopant ions.

In addition, in the formation of the P-type dopant region 35, it is preferable to perform a shallow dopant injection subsequent to the foregoing dopant injection (i.e., a two-step injection) for obtainment of enough dopant level at regions near the substrate surface. This shallow well injection can be formed under the conditions of an injection energy of 60 to 500 keV and an injection quantity of $5\times10^{11}$ to $1\times10^{14}$ cm$^{-2}$ for example, with $^{11}$B$^+$ ions used as the dopant ions. The dopant injection step for the P-type shallow well region 15 may be used also for this shallow dopant injection. In this case, the dopant injection process can be reduced by one step.

Thus, by the formation of the P-type dopant region 35, punch-throughs between the N-type deep well regions 12, 12 are suppressed. Accordingly, the margin between the N-type deep well regions 12, 12 is diminished, and the degree of integration can be improved, as compared with the semiconductor device of Embodiment 1.

EMBODIMENT 3

Figure 3:
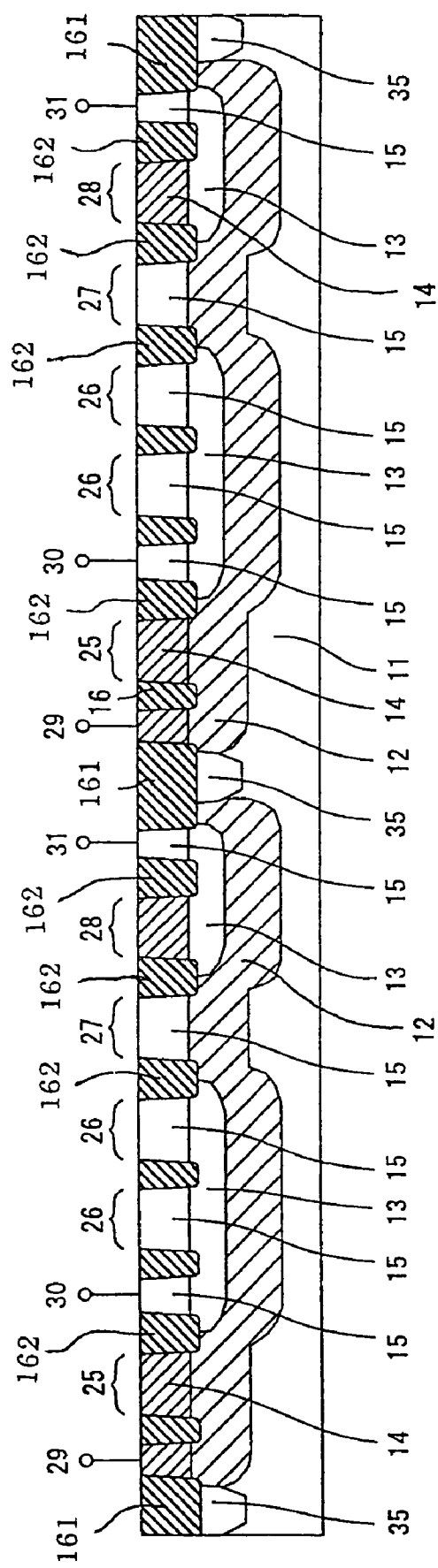
FIG. 3 is a sectional view showing a semiconductor device of Embodiment 3 of the invention.

Embodiment 3 of the present invention is described with reference to FIG. 3. FIG. 3 is a sectional view of a semiconductor device which is a third embodiment of the invention. In FIG. 3, gate insulator, gate electrode, source region, drain region, interlayer insulator and upper metal interconnects are omitted. Also, in FIG. 3, the same constituent parts as those shown in FIG. 2 are designated by the same reference numerals as those of FIG. 2 and their detailed description is omitted.

The semiconductor device of this Embodiment 3 differs from the semiconductor device of Embodiment 2 only in the following points.

Firstly, a device isolation region 161 having a width larger than the width of the foregoing device isolation region 16 is provided at places where the P-type dopant region 35 is provided for prevention of punch-throughs and parting of the N-type deep well regions 12, 12. As a result of this, parasitic capacitance between the well regions (silicon substrate) and gate lines or metal lines can be reduced. Further, it is no longer necessary to perform the shallow dopant injection that is performed to form the P-type dopant region 35 in the semiconductor device of Embodiment 2, and one time dopant injection suffices.

Secondly, a wide device isolation region 162 is provided also at places other than the places where the P-type dopant region 35 is to be formed. The width of this device isolation region 162 is set as follows. When the deep well regions 12, 13 differ in conductive type between the two sides of the device isolation region 162, for example, at the boundary between the N-type DTMOS 27 and the N-type substrate bias-variable transistor 26, the deep well region 12 on the N-type DTMOS 27 side is N-type and the deep well regions 13, 12 on the N-type substrate bias-variable transistor 26 side is of a P-type/N-type stacked structure. Since the N-type deep well region 12, which is the deeper side of the P-type/N-type stacked structure, gives no influences in terms of device isolation, it can be said that the deep well regions 12, 13 are opposite in conductive type between the two sides of the device isolation region 162. In this case, there arises a problem of punch-through between the P-type shallow well region 15 of the N-type DTMOS 27 and the P-type deep well region 13 of the N-type substrate bias-variable transistor 26. Further, there is a possibility that dopants contained in the N-type deep well regions 12 of the N-type DTMOSs 27 may be diffused, causing the threshold of the N-type substrate bias-variable transistors 26 to change. Another example is the boundary between the N-type DTMOS 27 and the P-type DTMOS 28, where similar problems may occur. In this case, between the two sides of the device isolation region 162 placed at the boundary, the shallow well regions 15, 14 are opposite in conductive type and moreover the deep well regions 12 and 13 are also opposite in conductive type. Otherwise, although not shown, similar problems may occur further at the boundary between the P-type DTMOS and the P-type substrate bias-variable transistor, the boundary between the P-type DTMOS and the N-type substrate bias-variable transistor, the boundary between the N-type DTMOS and the P-type substrate bias-variable transistor, and the boundary between the N-type substrate bias-variable transistor and the P-type substrate bias-variable transistor. Therefore, when the shallow well regions 14, 15 are opposite in conductive type between the two sides of the device isolation region 162, and when the deep well regions 12, 13 are opposite in conductive type between the two sides of the device isolation region 162, and when the shallow well regions 12, 13 are opposite in conductive type between the two sides of the device isolation region 162 and moreover the deep well regions 12, 13 are also opposite in conductive type, the width of the device isolation region 162 needs to be wide to such an extent that neither the aforementioned punch-through nor changes in threshold occur. For example, even if the dopant injection range for the deep well regions is set as shallow as about 0.3 μm, the dopants would spread also laterally in injection process, and moreover diffused further laterally due to subsequent thermal diffusion. Even under the injection conditions described above, it was impossible to suppress changes in threshold when the width of the device isolation region was less than 0.18 μm. Also, with the width of the device isolation region not less than 0.7 μm, the margin required for device isolation would be no longer negligible. Accordingly, for prevention of occurrence of the punch-through and changes in threshold, the width of the device isolation region 162 is preferably 0.18 μm to 0.7 μm. Meanwhile, when the shallow well region 14 or 15 is identical in conductive type between the two sides of the device isolation region 16 and moreover the deep well region 12 or 13 is also identical in conductive type (where the shallow well regions and the deep well regions may be different in conductive type for each other), smaller widths of the device isolation region 16 allow the margin to be reduced. Therefore, the width is normally set near machining limitations. In this case, the width of the device isolation region 16 may be set to, for example, 0.05 to 0.35 μm.

In the semiconductor device of this Embodiment 3, since the wide device isolation region 161 is provided on the P-type dopant region 35 serving for isolating the N-type deep well regions 12, 12 from each other, parasitic capacitance can be reduced. Therefore, higher-speed circuits or lower power consumption can be achieved. Also, the dopant injection process in forming the P-type dopant region 35 can be simplified. Thus, the manufacturing cost can be reduced.

EMBODIMENT 4

The semiconductor devices of Embodiments 1 to 3 have problems as described below.

In the semiconductor devices of Embodiment 1 to 3, the N-type deep well region 12 in a circuit block of P-type substrate bias-variable transistors 25, 25 is integrated with the N-type deep well region 12 in a circuit block of N-type substrate bias-variable transistors 26 and in a circuit block of DTMOSs 27, 28. Therefore, changing over between active and standby states in a circuit block of the P-type substrate bias-variable transistors 25, 25 causes the bias of the whole N-type deep well region 12 to change, which in turn causes large amounts of charges to be charged and discharged. As a result, the power consumption increases.

Furthermore, in the foregoing semiconductor devices of Embodiment 1 to 3, putting the P-type substrate bias-variable transistors 25 into the active state (i.e., giving a voltage lower than the power supply voltage to the N-type deep well regions 12) makes it more likely that a latch-up phenomenon is induced. In an NPNP structure having routes passing through the N-type shallow well region 14, the P-type deep well region 13, the N-type deep well region 12 of the P-type DTMOS 28 and the P-type shallow well region 15 of the N-type DTMOS 27, a case (undershoot) is discussed where a bias lower than ground voltage is applied to the N-type shallow well region 14 of the P-type DTMOS 28. In the DTMOSs 27, 28, in which the gate electrode and the shallow well regions 15, 14 are electrically connected to each other, it can occur that a bias not more than the ground voltage is applied to the N-type shallow well region 14 of the P-type DTMOS 28 through the gate electrode. In this case, a forward voltage is applied to the junction between the N-type shallow well region 14 of the P-type DTMOS 28 and the P-type deep well region 13, so that electrons are injected into the P-type deep well region 13. The electrons injected into the P-type deep well region 13 reach the N-type deep well region 12, causing the voltage of the N-type deep well region 12 to decrease. With the voltage of the N-type deep well region 12 decreased, holes are injected from the P-type shallow well region 15 of the N-type DTMOS 27 into the N-type deep well region 12. The holes injected into the N-type deep well region 12 reach the P-type deep well region 13, causing the voltage of the P-type deep well region 13 to increase. With the voltage of the P-type deep well region 13 increased, electrons injected from the N-type shallow well region 14 of the P-type DTMOS 28 into the P-type deep well region 13 increase more and more. Through iterations of these process (with a positive feedback applied), an abnormal current flows in the NPNP structure, giving rise to a latch-up phenomenon. In this connection, if a voltage lower than the power supply voltage has been applied to the N-type deep well region 12 from the beginning (i.e., if the P-type substrate bias-variable transistor 25 has been in an active state), the latch-up phenomenon is more likely to occur. Further, also when the P-type substrate bias-variable transistor 25 comes into a standby state (i.e., also when a voltage higher than the power supply voltage is applied to the N-type deep well region 12), it become more likely that a latch-up phenomenon is induced. In this case, a large inverse-bias is applied to the junction between the P-type shallow well region 15 and the N-type deep well region 12 of the N-type DTMOS 27, as well as to the junction between the P-type deep well region 13 and the N-type deep well region 12. This causes a punch-through to occur between the P-type shallow well region 15 of the N-type DTMOS 27 and the P-type deep well region 13, triggering the occurrence of a latch-up phenomenon in the NPNP structure. As to the route of the latch-up, in addition to the above-mentioned one, such an NPNP structure may also be mentioned as one including a route which passes the drain region of the N-type DTMOS 27, the P-type shallow well region 15 of the N-type DTMOS 27, the N-type deep well region 12 and the P-type deep well region 13. Thus, largely changing bias of the N-type deep well region 12 makes it difficult to control the latch-up phenomenon. As a result, the device reliability deteriorates.

Embodiment 4 of the present invention has solved the above-described problems, and is described with reference to FIGS. 4 to 8.

Figure 4:
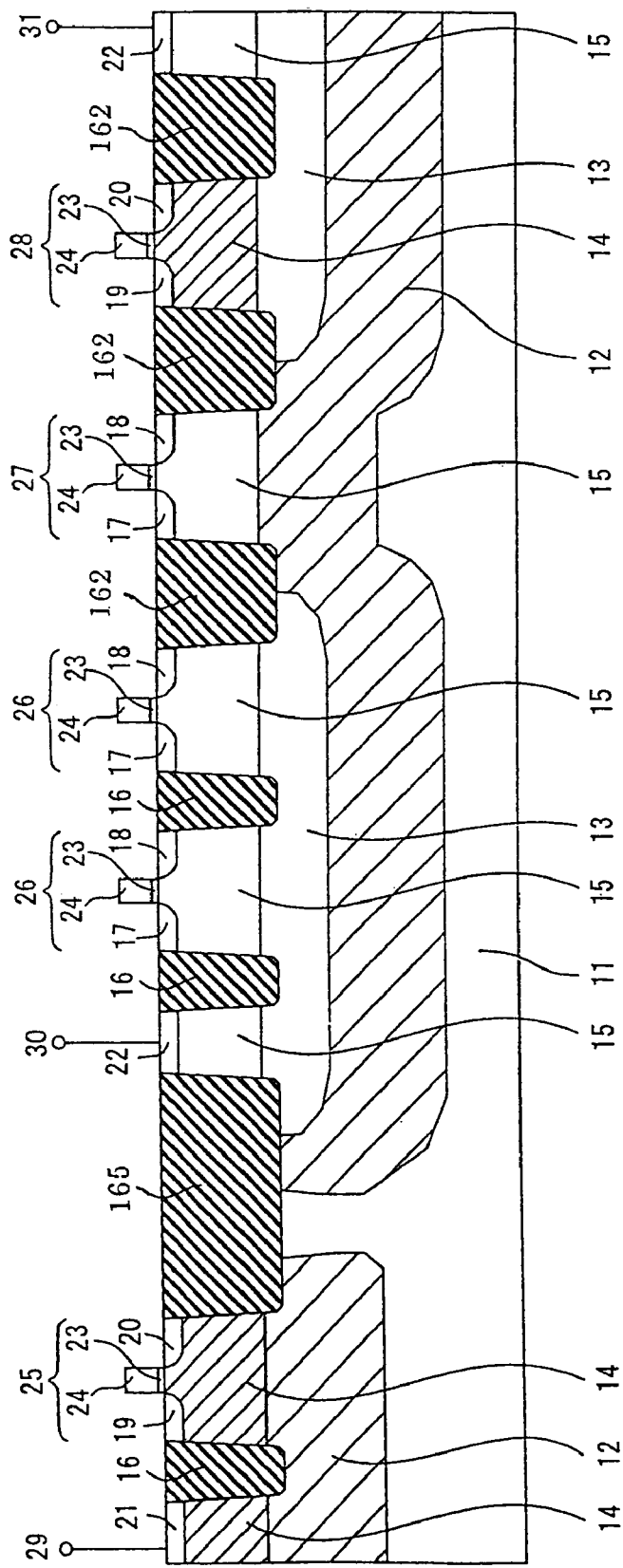
FIG. 4 is a sectional view showing a semiconductor device of Embodiment 4 of the invention.
Figure 5:
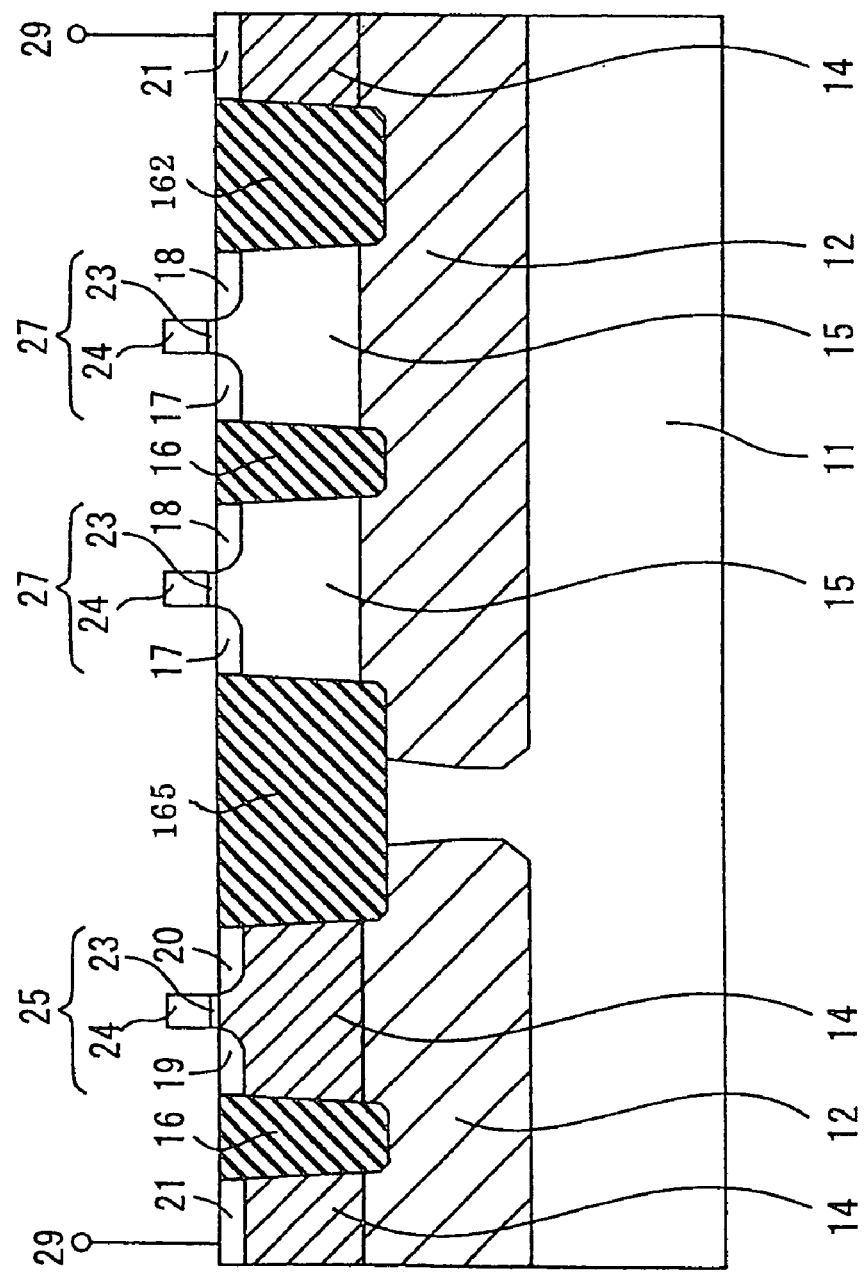
FIG. 5 is a sectional view showing the semiconductor device of Embodiment 4 of the invention.
Figure 6:
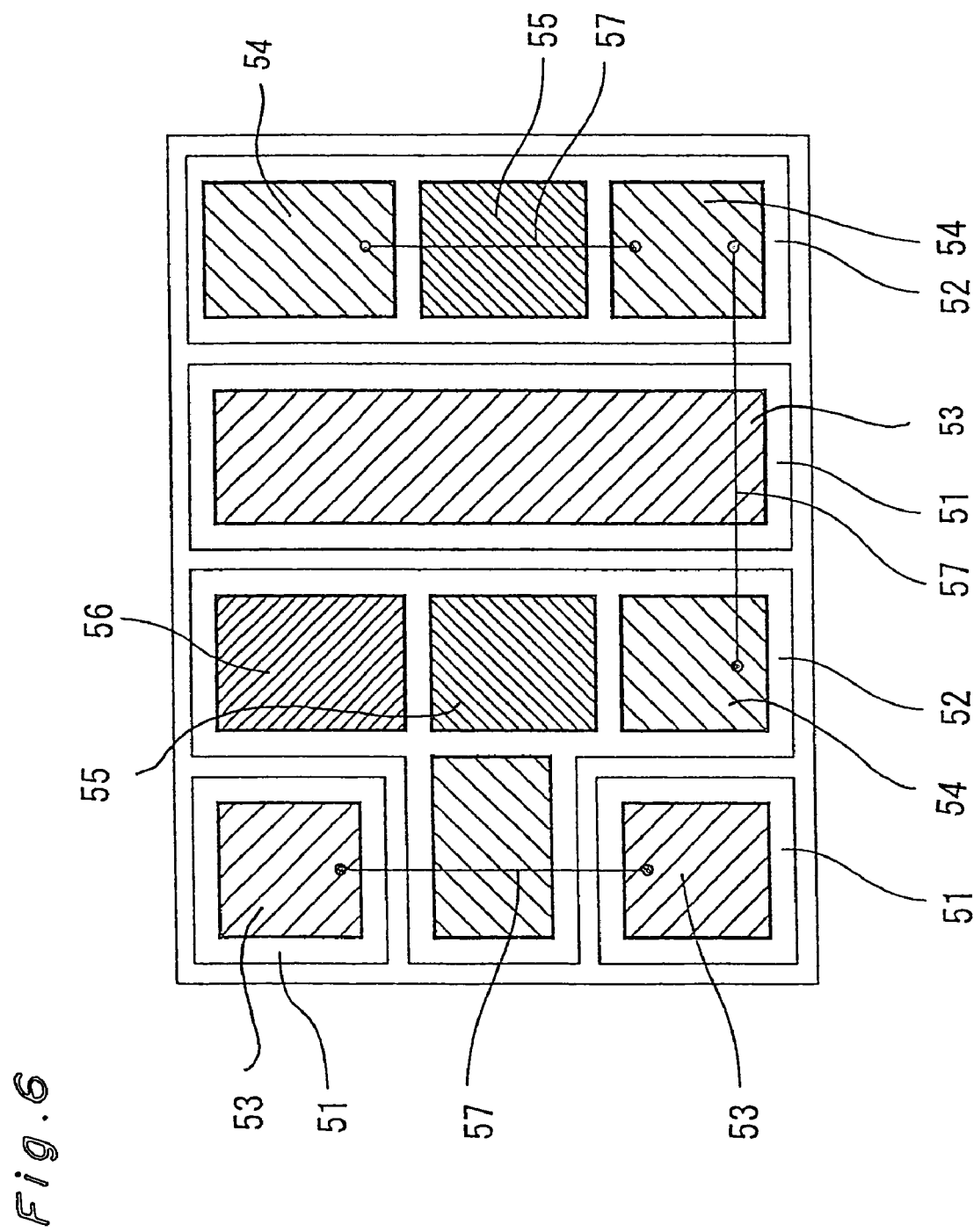
FIG. 6 is a plan view schematically showing the semiconductor device of Embodiment 4 of the invention.

FIGS. 4 and 5 are sectional views showing a semiconductor device of Embodiment 4 of the invention. In FIGS. 4 and 5, interlayer insulator and upper metal interconnects are omitted. FIG. 6 is a schematic view of a plan.

First, the semiconductor device of this embodiment is explained with reference to FIG. 4. The semiconductor device shown in FIG. 4 differs from the semiconductor devices shown in FIGS. 1 to 3 in the following points. That is, the N-type deep well region 12 in a circuit block of P-type substrate bias-variable transistors 25, 25 is electrically isolated from the N-type deep well region 12 in a circuit block of N-type substrate bias-variable transistors 26, 26 and in a circuit block of the DTMOS portion (a region including DTMOSs 27, 28). At a place where the N-type deep well regions 12, 12 are isolated, a device isolation region 165 is provided as depicted in FIG. 4. With this provision of the device isolation region 165 at a place where the N-type deep well regions 12, 12 are isolated, the parasitic capacitance with the gate lines or the upper metal interconnects can be decreased as compared with the case where the device isolation region 165 is not provided.

Preferably, the place where the N-type deep well regions 12, 12 are parted from each other is determined so that an input voltage from the well-bias input terminal 29 to the P-type substrate bias-variable transistor 25 ranges to neither the circuit block of N-type substrate bias-variable transistors 26, 26 nor the DTMOS portion. That is, the place where the N-type deep well regions 12, 12 are parted from each other is, preferably, determined at the boundary between a circuit block of P-type substrate bias-variable transistors 25 and a circuit block of N-type substrate bias-variable transistors 26, or the boundary between a circuit block of N-type substrate bias-variable transistors 26 and the DTMOS portion. FIG. 5 shows a sectional view of the boundary between the circuit block of P-type substrate bias-variable transistors 25 and the N-type DTMOS portion (a region including the N-type DTMOS 27). The boundary between the circuit block of P-type substrate bias-variable transistors 25 and the N-type DTMOS portion (a region including the N-type DTMOS 27) is similar to the case of the boundary between a circuit block portion of P-type substrate bias-variable transistors 25 and a circuit block of N-type substrate bias-variable transistors 26.

Next, the semiconductor device of this Embodiment 4 is explained with reference to FIG. 6. It is noted that individual interconnects and bias generation circuits to make up the circuit are omitted in FIG. 6. On a semiconductor substrate is a region 51 over which a voltage-varying N-type deep well region (an N-type deep well region connected to the well-bias input terminal for the P-type substrate bias-variable transistors) is formed. Further, on the semiconductor substrate is a region 52 over which a voltage-fixed N-type deep well region is formed. Within the region 51 over which a voltage-varying N-type deep well region is formed, a block 53 composed of P-type substrate bias-variable transistors is formed. Within the voltage-fixed N-type deep well region 52, a block 54 composed of N-type substrate bias-variable transistors, a block 55 composed of N-type DTMOSs, and a block 56 composed of P-type DTMOSs are formed.

The block 53 composed of P-type substrate bias-variable transistors is connected to another block 53 composed of P-type substrate bias-variable transistors by an upper interconnect 57 that connects together common well regions of the substrate bias-variable transistors. The blocks 53, 53 composed of P-type substrate bias-variable transistors and connected to each other in this way form one circuit block (composed of P-type substrate bias-variable transistors). To the common well region of this circuit block, the power supply voltage or a voltage lower than the power supply voltage is given in an active state and a voltage higher than the power supply voltage is given in a standby state, from a bias generation circuit.

The block 54 composed of N-type substrate bias-variable transistors is connected to another block 54 composed of N-type substrate bias-variable transistors by an upper interconnect 57 that connects together common well regions of the N-type substrate bias-variable transistors. The blocks 54, 54 composed of N-type substrate bias-variable transistors and connected to each other in this way form one circuit block (composed of N-type substrate bias-variable transistors). To the common well region of this circuit block, a 0 V or positive voltage is given in an active state and a negative voltage is given in a standby state, from a bias generation circuit.

With the use of the well structure shown in FIGS. 4 and 5 and further with an arrangement shown in FIG. 6, a plurality of circuit blocks of substrate bias-variable transistors can easily be formed in a circuit in which substrate bias-variable transistors and DTMOSs are mixedly contained. Furthermore, complementary MOS (CMOS) circuits can be made up by connecting N-type devices and P-type devices with the upper interconnects.

Next, the procedure for fabricating the semiconductor device shown in FIGS. 4 to 6 is described.

The procedure for fabricating the semiconductor device of this Embodiment 4 is the same as that for fabricating the semiconductor device of Embodiment 1. A case of forming the deep well region of the semiconductor device shown in FIG. 4 is explained with reference to FIGS. 7 and 8.

Figure 7:
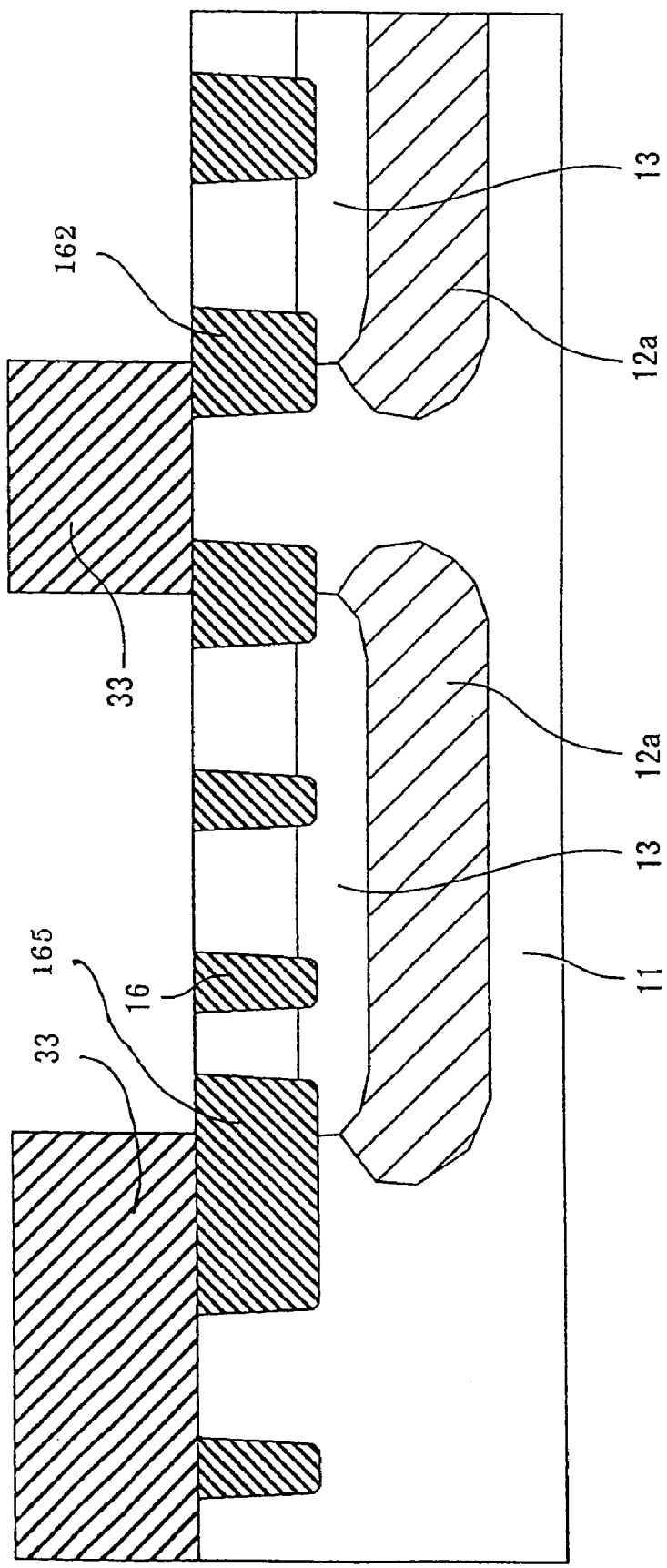
FIG. 7 is a view showing the method of fabricating deep well regions of the semiconductor device of Embodiment 4.

As shown in FIG. 7, with photoresist 33 used as a mask, the N-type deep well region 12a is formed on the semiconductor substrate 11. An example of dopant ions that give the N-type conductivity is $^{31}P^+$. For example, when $^{31}P^+$ is used as dopant ions, the well region can be formed under the conditions of an injection energy of 500 to 3000 keV and an injection quantity of $5\times10^{11}$ to $1\times10^{14}$ cm$^{-2}$. Subsequently, with the same mask 33 used, the P-type deep well region 13 is formed at a position shallower than the N-type deep well region 12a. An example of dopant ions that give the P-type conductivity is $^{11}B^+$. For example, when $^{11}B^+$ ions are used as dopant ions, the well region can be formed under the conditions of an injection energy of 100 to 1000 keV and an injection quantity of $5\times10^{11}$ to $1\times10^{14}$ cm$^{-2}$.

Figure 8:
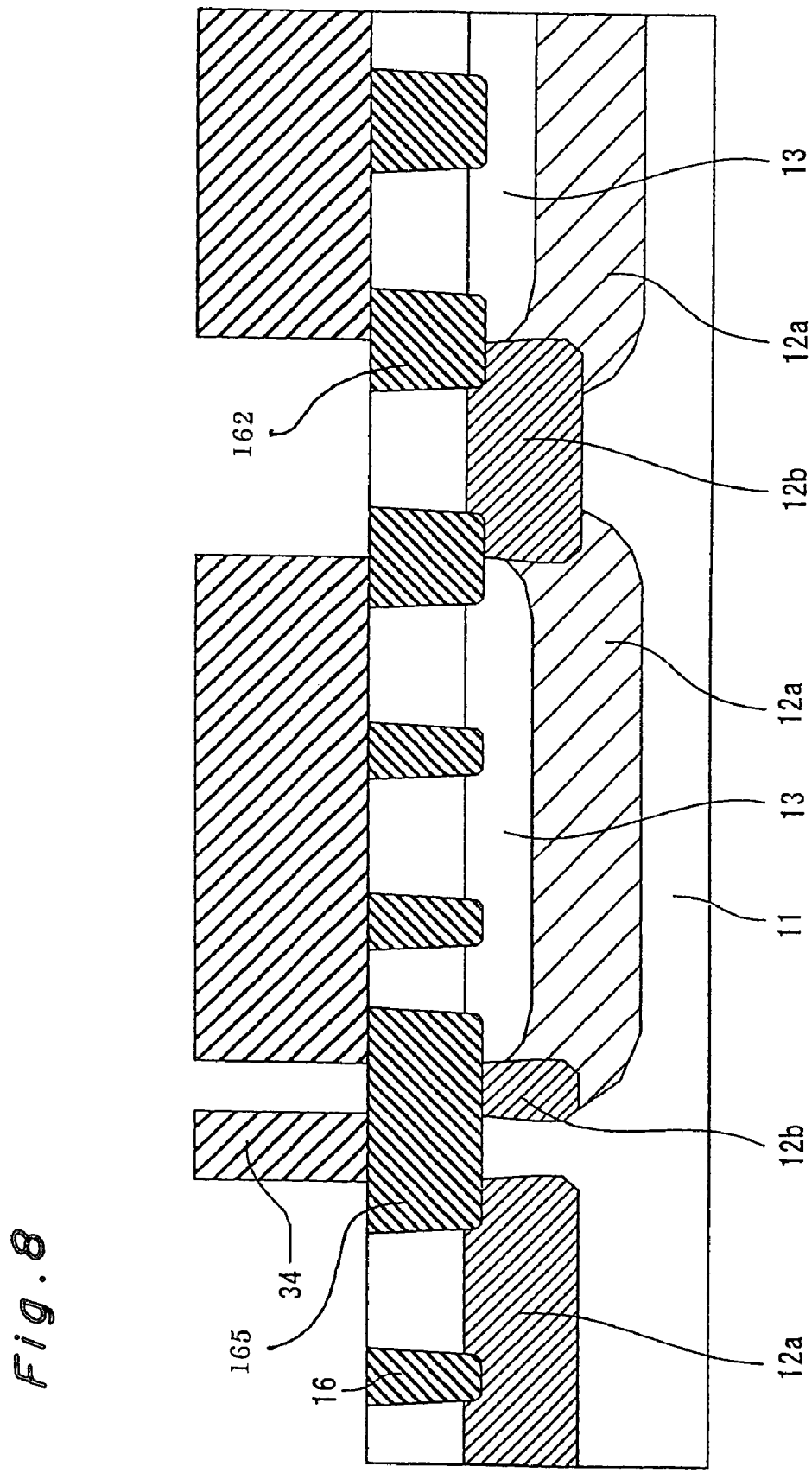
FIG. 8 is a view showing the method of fabricating deep well regions of the semiconductor device of Embodiment 4.

Next, as shown in FIG. 8, with photoresist 34 used as a mask, the N-type deep well region 12b is formed. The depth of dopant injection for the N-type deep well region 12b is preferably shallower than that of the N-type deep well region 12a and generally equal to that of the P-type deep well region 13. An example of dopant ions that give the N-type conductivity is $^{31}P^+$. For example, when $^{31}P^+$ is used as dopant ions, the well region can be formed under the conditions of an injection energy of 240 to 1500 keV and an injection quantity of $5\times10^{11}$ to $1\times10^{14}$ cm$^{-2}$. The region 12a and the region 12b are integrated together to form an N-type deep well region. Also, by parting the N-type deep well region 12b (masking with the photoresist 34 so that dopant injection is not applied thereto), the N-type deep well regions can be electrically isolated from each other.

It is noted that the N-type deep well regions 12 are electrically isolated from each other by the semiconductor substrate (P-type conductivity) 11. The semiconductor substrate 11, which is generally low in dopant level (about $10^{15}$ cm$^{-3}$), needs to have enough isolation width in order to prevent the punch-throughs between the N-type deep well regions 12, 12. For the prevention of punch-throughs between the N-type deep well regions 12, 12, it is also allowable to inject a P-type dopant to between the N-type deep well regions 12, 12 with one more lithography photomask increased, as has been done in Embodiment 2 or Embodiment 3.

Although the above description has been made on a case where only the substrate bias-variable transistors 25, 26 and the DTMOSs 27, 28 are involved for explanation's sake, it is also possible that MOSFETs of normal structure are mixed. In this case, the voltage for the shallow well regions may appropriately be fixed for devices that are to be normal MOSFETs.

As shown in FIGS. 4 and 5, in the above semiconductor device, the shallow well regions 15, 14 of the DTMOSs 27, 28 are electrically isolated from device to device by the deep well regions 12, 13 of opposite conductive types and the device isolation region 162. Also, the common well regions 12, 14 of P-type substrate bias-variable transistors 25 are electrically isolated from circuit block to circuit block by the device isolation region 165 and the P-type semiconductor region 11. Furthermore, the common well regions 13, 15 of N-type substrate bias-variable transistors 26 are electrically isolated from circuit block to circuit block by the device isolation regions 162, 165 and the N-type deep well region 12.

Therefore, according to the semiconductor device of this Embodiment 4, any arbitrary number of circuit blocks of the substrate bias-variable transistors 25, 26 can be formed for each conductive type. As a result of this, it becomes implementable to properly divide the circuit blocks into active-state circuit blocks and standby-state circuit blocks, thus making it possible to reduce the power consumption of the semiconductor device.

Moreover, according to the semiconductor device of this Embodiment 4, the area of the PN junction between the common well regions 12, 14 and 13, 15 of the substrate bias-variable transistors 25, 26 and their neighboring well regions of the opposite conductive type can be suppressed to one approximately equally to the area of the circuit block of the substrate bias-variable transistors 25, 26. Therefore, in the semiconductor device of this Embodiment 4, quantities of charges and discharges upon changes in the voltage of the common well regions of the substrate bias-variable transistors 25, 26 are reduced. As a result of this, the power consumption of the semiconductor device can be reduced.

Furthermore, according to the semiconductor device of this Embodiment 4, the voltage for the N-type deep well regions 12 is fixed in the block of N-type substrate bias-variable transistors 26 and the block of DTMOSs 27, 28. Therefore, it becomes easier to control the latch-up phenomenon. As a result of this, the reliability of the semiconductor device is improved.

EMBODIMENT 5

Although not shown, a CMOS circuit may also be made up by using the semiconductor device according to any one of Embodiments 1 to 4. A CMOS circuit of low power consumption and high speed can be implemented by properly combining respective advantages of the DTMOSs that are capable of obtaining high drive current with low voltage drive, and the substrate bias-variable transistors that are capable of reducing the off-leak current to quiet a small one. Furthermore, when a plurality of circuit blocks of the substrate bias-variable transistors are formed and circuit blocks other than those which should be put into the active state are put into the standby state, the CMOS circuit can be made even lower in power consumption.

EMBODIMENT 6

The semiconductor device according to any one of Embodiments 1 to 5 can be used for battery-driven portable electronic devices, in particular, personal digital assistants. The portable electronic devices may be exemplified by personal digital assistants, cellular phones, game devices, and the like.

Figure 9:
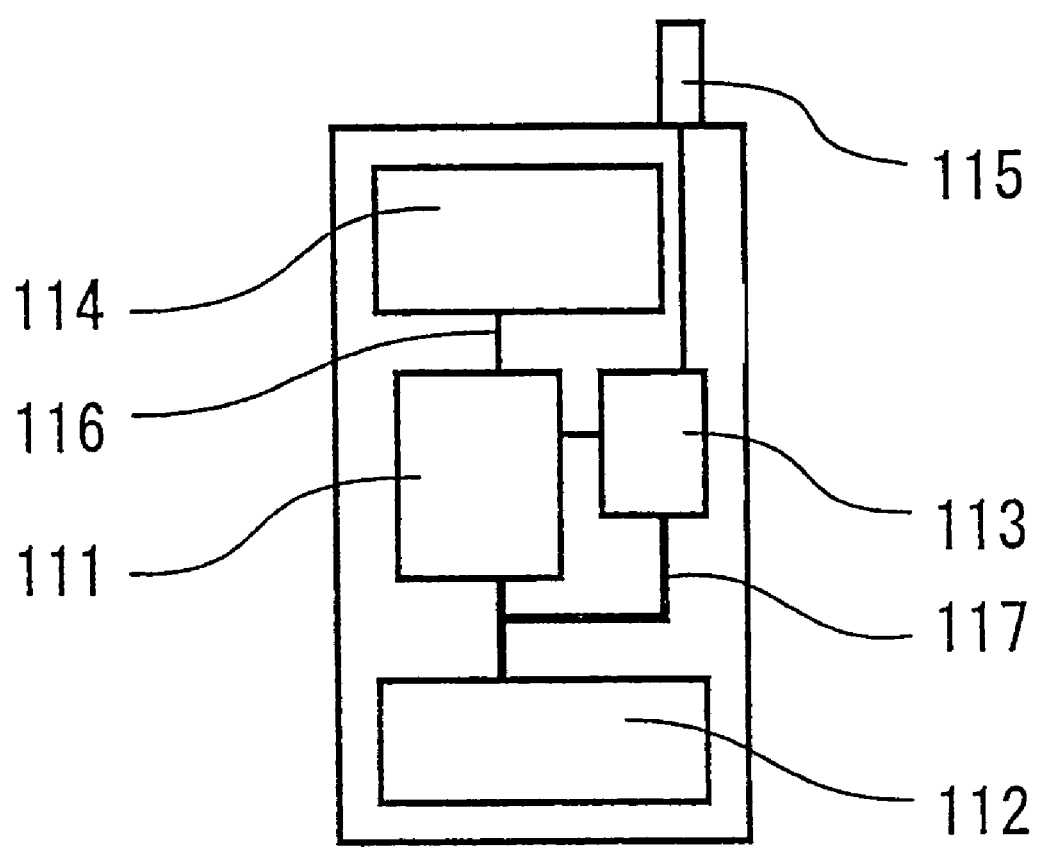
FIG. 9 is a block diagram showing a portable electronic device of the present invention.

FIG. 9 shows a case exemplified by a cellular phone. A semiconductor device of the present invention is incorporated into a control circuit 111. It is noted that the control circuit 111 may also be formed of an LSI (Large-Scale Integrated circuit) on which logic circuits made of the semiconductor device of the invention and memory are mixedly mounted. Reference numeral 112 denotes a battery, 113 denotes an RF (Radio-Frequency) circuit part, 114 denotes a display part, 115 denotes an antenna part, 116 denotes a signal line, and 117 denotes a power supply line.

By applying the semiconductor device of the invention to a portable electronic device, it becomes realizable to lower the power consumption of the LSI part to a large extent while the functions and operating speed of the portable electronic device are maintained. As a result of this, the battery life can be prolonged to a large extent.

The semiconductor device of the present invention is a semiconductor device including DTMOSs and substrate-bias variable transistors, in which deep well regions opposite in conductive type to the semiconductor substrate are electrically isolated.

With this arrangement, a plurality of circuit blocks of substrate bias-variable transistors can be formed for each of different conductive types. Therefore, it becomes possible to properly divide the circuit blocks into circuit blocks that should be put into the active state and circuit blocks that should be put into the standby state, for either conductive type, so that the power consumption of the semiconductor device can be reduced.

Also, in one embodiment of the invention, the deep well regions in a circuit block composed of substrate bias-variable transistors and the deep well regions in other device portions (a circuit block of substrate bias-variable transistors of opposite conductive type and DTMOS portion) are electrically isolated from each other. Therefore, parasitic capacitance due to the PN junction at boundaries of deep well regions can be reduced, so that the power consumption of the semiconductor device can be reduced. Still also, since the voltage for the deep well regions of the DTMOS portion can be fixed, the latch-up phenomenon can be suppressed.

Also, in the semiconductor device of one embodiment of the invention, for a case where a shallow well region located on one side of a device isolation region and a shallow well region on the other side are different in conductive type from each other, and where a deep well region located on one side of the device isolation region and a deep well region located on the other side are different in conductive type from each other, the width of the device isolation region is made wider than the width of a device isolation region in which shallow well regions located on both sides are identical in conductive type to each other and moreover deep well regions located on both sides are identical in conductive type to each other. Therefore, punch-throughs between well regions and threshold shifts of devices due to dopant diffusion can be suppressed.

Also, the portable electronic device of the present invention, into which the above-described semiconductor device of the invention is incorporated, is capable of reducing the power consumption of the LSI part to a large extent, thus allowing the battery life to be prolonged to a large extent.

The invention claimed is:

1. A semiconductor device comprising:
one first-conductive-type semiconductor substrate;
a plurality of second-conductive-type deep well regions formed in the semiconductor substrate;
a first-conductive-type deep well region formed in the second-conductive-type deep well regions;
a first first-conductive-type shallow well region formed on the first-conductive-type deep well region;
a first second-conductive-type shallow well region formed on the first-conductive-type deep well region;
a second first-conductive-type shallow well region formed on the second-conductive-type deep well regions;
a second second-conductive-type shallow well region formed on the second-conductive-type deep well regions;
a device isolation region;
a second-conductive-type field effect transistor formed on the first first-conductive-type shallow well region;
an input terminal which is formed on the first first-conductive-type shallow well region and which serves for changing a substrate bias of the second-conductive-type field effect transistor;
a first-conductive-type field effect transistor formed on the second second-conductive-type shallow well region;
an input terminal which is formed on the second second-conductive-type shallow well region and which serves for changing a substrate bias of the first-conductive-type field effect transistor;
a second-conductive-type dynamic threshold transistor which is formed on the second first-conductive-type shallow well region and in which a gate electrode and the second first-conductive-type shallow well region are electrically connected to each other; and
a first-conductive-type dynamic threshold transistor which is formed on the first second-conductive-type shallow well region and in which a gate electrode and the first second-conductive-type shallow well region are electrically connected to each other, wherein
the second first-conductive-type shallow well region is electrically isolated from device to device by the device isolation region and the second-conductive-type deep well regions, and
the first second-conductive-type shallow well region is isolated from device to device by the device isolation region and the first-conductive-type deep well region,
wherein the plurality of second-conductive-type deep well regions are electrically isolated at a boundary between the first-conductive-type field effect transistor and the second-conductive-type field effect transistor, at a boundary between the first-conductive-type field effect transistor and the first-conductive-type dynamic threshold transistor, or at a boundary between the first-conductive-type field effect transistor and the second-conductive-type dynamic threshold transistor.

2. The semiconductor device according to claim 1, wherein the plurality of second-conductive-type deep well regions are electrically isolated by the first-conductive-type semiconductor substrate.

3. The semiconductor device according to claim 1, wherein a first-conductive-type dopant region is formed between the plurality of second-conductive-type deep well regions, and the plurality of second-conductive-type deep well regions are electrically isolated by the first-conductive-type semiconductor substrate and the first-conductive-type dopant region.

4. The semiconductor device according to claim 1, wherein a device isolation region is formed between the plurality of second-conductive-type deep well regions, and the plurality of second-conductive-type deep well regions are electrically isolated by the first-conductive-type semiconductor substrate and the device isolation region.

5. The semiconductor device according to claim 1, wherein a first-conductive-type dopant region and a device isolation region are formed between the plurality of second-conductive-type deep well regions, and the plurality of second-conductive-type deep well regions are electrically isolated by the first-conductive-type semiconductor substrate, the first-conductive-type dopant region and the device isolation region.

6. The semiconductor device according to claim 1, wherein out of the device isolation regions, given a width A of either a device isolation region of which a shallow well region placed on one side and a shallow well region placed on the other side are different in conductive type from each other, or a device isolation region of which a deep well region placed on one side and a deep well region placed on the other side are different in conductive type from each other and moreover which is in contact with the deep well regions placed on both sides thereof, and given a width B of a device isolation region of which a shallow well region placed on one side and a shallow well region placed on the other side are identical in conductive type to each other and of which a deep well region placed on one side and a deep well region placed on the other side are identical in conductive type to each other and which is in contact with the deep well regions placed on both sides thereof, then A>B.

7. The semiconductor device according to claim 1, wherein out of the device isolation regions, given a width A of either a device isolation region of which a shallow well region placed on one side and a shallow well region placed on the other side are different in conductive type from each other, or a device isolation region of which a deep well region placed on one side and a deep well region placed on the other side are different in conductive type from each other and moreover which is in contact with the deep well regions placed on both sides thereof, then 0.18 µm<A<0.7 µm.

8. The semiconductor device according to claim 1, wherein the device isolation regions are formed of STI (Shallow Trench Isolation).

9. The semiconductor device according to claim 1, wherein a complementary circuit is made up by the first-conductive-type dynamic threshold transistor and the second-conductive-type dynamic threshold transistor, or by the first-conductive-type field effect transistor and the second-conductive-type field effect transistor, or by the first-conductive-type dynamic threshold transistor and the second-conductive-type field effect transistor, or by the first-conductive-type field effect transistor and the second-conductive-type dynamic threshold transistor.

10. A portable electronic device which includes the semiconductor device as defined in claim 1.

11. A semiconductor device, comprising:
one first-conductive-type semiconductor substrate;
a plurality of second-conductive-type deep well regions formed in the semiconductor substrate;
a plurality of blocks, each block comprising one of said second-conductive-type deep well regions, each of said blocks comprising:
  at least one first-conductive-type deep well region formed in the second-conductive-type deep well region associated with the block,
  at least one second-conductive-type field effect transistor in electrical connection to said at least one first-conductive-type deep well region,
  at least one first-conductive-type field effect transistor in electrical connection to said second-conductive-type deep well region associated with the block,
  at least one first-conductive-type dynamic threshold transistor in electrical connection to said at least one first-conductive-type deep well region, and
  at least one second-conductive-type dynamic threshold transistor in electrical connection to said second-conductive-type deep well region associated with the block; and
wherein the plurality of second-conductive-type deep well regions are electrically isolated at a boundary between the first-conductive-type field effect transistor located within a block and the second-conductive-type field effect transistor located within another neighboring block.

12. A semiconductor device, comprising:
one first-conductive-type semiconductor substrate;
a plurality of second-conductive-type deep well regions formed in the semiconductor substrate;
a plurality of blocks, each block comprising one of said second-conductive-type deep well regions, each of said blocks comprising:
  at least one first-conductive-type deep well region formed in the second-conductive-type deep well region associated with the block,
  at least one second-conductive-type field effect transistor in electrical connection to said at least one first-conductive-type deep well region,
  at least one first-conductive-type field effect transistor in electrical connection to said second-conductive-type deep well region associated with the block,
  at least one first-conductive-type dynamic threshold transistor in electrical connection to said at least one first-conductive-type deep well region, and
  at least one second-conductive-type dynamic threshold transistor in electrical connection to said second-conductive-type deep well region associated with the block; and
wherein the plurality of second-conductive-type deep well regions are electrically isolated at a boundary between the first-conductive-type field effect transistor located within a block and the first-conductive-type dynamic threshold transistor located within another neighboring block.

13. A semiconductor device, comprising:
one first-conductive-type semiconductor substrate;
a plurality of second-conductive-type deep well regions formed in the semiconductor substrate;
a plurality of blocks, each block comprising one of said second-conductive-type deep well regions, each of said blocks comprising:
  at least one first-conductive-type deep well region formed in the second-conductive-type deep well region associated with the block,
  at least one second-conductive-type field effect transistor in electrical connection to said at least one first-conductive-type deep well region,
  at least one first-conductive-type field effect transistor in electrical connection to said second-conductive-type deep well region associated with the block,
  at least one first-conductive-type dynamic threshold transistor in electrical connection to said at least one first-conductive-type deep well region, and
  at least one second-conductive-type dynamic threshold transistor in electrical connection to said second-conductive-type deep well region associated with the block; and
wherein the plurality of second-conductive-type deep well regions are electrically isolated at a boundary between the first-conductive-type field effect transistor located within a block and the second-conductive-type dynamic threshold transistor located within another neighboring block.

* * * * *

UNITED STATES PATENT AND TRADEMARK OFFICE
CERTIFICATE OF CORRECTION

PATENT NO. : 7,084,465 B2  Page 1 of 1
APPLICATION NO. : 10/451744
DATED : August 1, 2006
INVENTOR(S) : Akihide Shibata et al.

It is certified that error appears in the above-identified patent and that said Letters Patent is hereby corrected as shown below:

On the title page:

Item (22) PCT Filed: "December 26, 2001" should be --December 21, 2001--.

Signed and Sealed this

Nineteenth Day of February, 2008

JON W. DUDAS
*Director of the United States Patent and Trademark Office*